United States Patent

Iwai et al.

[11] Patent Number: 5,885,746
[45] Date of Patent: Mar. 23, 1999

[54] PHOTOSENSITIVE RESIN COMPOSITION, PHOTOSENSITIVE PRINTING PLATE USING THE SAME AND METHOD OF MANUFACTURING PRINTING MASTER PLATE

[75] Inventors: Takeshi Iwai, Sagamihara; Hiroshi Komano, Koza-gun, both of Japan

[73] Assignee: Tokyo Ohka Kogyo Co., Ltd., Kanagawa, Japan

[21] Appl. No.: 580,356

[22] Filed: Dec. 28, 1995

[30] Foreign Application Priority Data

Dec. 29, 1994 [JP] Japan ................................ 6-339107

[51] Int. Cl.$^6$ ............................ G03F 7/029; G03F 7/031; G03F 7/033; G03F 7/037
[52] U.S. Cl. ............................ 430/280.1; 430/281.1; 430/288.1; 430/285.1; 522/4; 522/12
[58] Field of Search ................ 522/4, 12; 430/281.1, 430/280.1, 288.1, 285.1

[56] References Cited

U.S. PATENT DOCUMENTS

| | | | |
|---|---|---|---|
| 3,106,466 | 10/1963 | Sprague et al. | 96/48 |
| 4,239,609 | 12/1980 | Barzynski et al. | |
| 4,258,123 | 3/1981 | Nagashima et al. | 430/281.1 |
| 4,425,424 | 1/1984 | Altland et al. | 430/270.1 |
| 4,659,649 | 4/1987 | Dickinson et al. | 430/280.1 |
| 4,774,163 | 9/1988 | Higashi | 430/281.1 |
| 4,816,379 | 3/1989 | Bronstert et al. | 430/281.1 X |
| 4,845,011 | 7/1989 | Wilczak et al. | 430/281.1 |
| 5,030,548 | 7/1991 | Fujikura et al. | |
| 5,130,228 | 7/1992 | Wade et al. | 430/280.1 X |
| 5,212,307 | 5/1993 | Wilczak | |
| 5,322,762 | 6/1994 | Kushi et al. | |
| 5,330,882 | 7/1994 | Kawaguchi et al. | 522/4 X |
| 5,453,340 | 9/1995 | Kawabata et al. | 522/4 X |
| 5,472,991 | 12/1995 | Schmitt et al. | 522/4 |

FOREIGN PATENT DOCUMENTS

| | | |
|---|---|---|
| 0 379 200 | 7/1990 | European Pat. Off. |
| 0 388 875 | 9/1990 | European Pat. Off. |
| 60-239736 | 11/1985 | Japan |
| 5-72739 | 3/1993 | Japan |
| 1 388 492 | 3/1975 | United Kingdom |
| 2 195 121 | 3/1988 | United Kingdom |
| 2 273 101 | 6/1994 | United Kingdom |

*Primary Examiner*—Cynthia Hamilton
*Attorney, Agent, or Firm*—Finnegan, Henderson, Farabow, Garrett & Dunner, L.L.P.

[57] ABSTRACT

A photosensitive resin composition comprising a high polymer binder, a monomer, a photopolymerization initiator generating a radical on exposure to visible light of a wavelength of 400 to 700 nm such as triazine compounds, titanocene compounds, or acridine compounds, an optically-activated acid generating agent generating an acid on exposure to light of a wavelength of 200 to 380 nm, and a color former developing a color in the presence of an acid, and a method manufacturing a printing master plate comprising the steps of exposing a photosensitive printing plate which has a laminated layer made from a photosensitive resin composition thereon to visible light of wavelength in the range of 400 to 600 nm selectively in an imagewise configuration in order to harden the resin composition layer, developing the photosensitive printing plate, and further exposing the developed plate to light of a wavelength in the range 200 to 380 nm.

19 Claims, No Drawings

PHOTOSENSITIVE RESIN COMPOSITION, PHOTOSENSITIVE PRINTING PLATE USING THE SAME AND METHOD OF MANUFACTURING PRINTING MASTER PLATE

FIELD OF THE INVENTION

The present invention relates to a photosensitive resin composition, photosensitive printing plate using the same, and a method of manufacturing printing master plate. More particularly, it relates to a photosensitive resin composition used for a photosensitive printing plate that has especially a high sensitivity, a high resolution, and an excellent storage stability which is curable on exposure to visible laser light, a photosensitive printing plate using the same, and a method of manufacturing a printing master plate from the photosensitive printing plate.

BACKGROUND OF THE INVENTION

A photosensitive printing plate in which photosensitive layer and a oxygen-barrier layer are sequentially laminated on a substrate has been widely used in the offset printing heretofore. With the aid of the recent technological advancement of electronic devices, the speed of manufacturing a printing master plate has been greatly, increased, since a process from writing a manuscript, input of image data, editing, proofreading to manufacturing of a printing master plate has been placed as a whole under control of a computer system even in the field of printing.

Exposure to a visible laser light is suitable for a high speed plate manufacturing, because argon laser of a wavelength of 488 nm is especially preferred due to the maskless exposure. As a photosensitive printing plate suitable for such a laser exposure, one for instance, as typically disclosed in the specification of U.S. Pat. No. 3,106,466 and the like is proposed. However, the aforementioned photosensitive printing plate does not have a wide range of wavelengths in photosensitivity enough to have the feature of the laser exposure fully exerted. For the reason, a photosensitive printing plate was proposed in Japanese Patent Application No. SHO 60-239,736(hereinafter abbreviated as JP-A-60-239,736 and the abbreviation is generally applied to the other) in which a sensitizer comprising an s-triazine compound was contained and thereby the photosensitive range of wavelengths was expanded to a range from near ultraviolet to visible light.

The photosensitive printing plate thus proposed in JP-A-60-239,736 is high in sensitivity, but has the faults that the degree of distinctiveness of pattern elements (hereafter simply referred to as degree of pattern distinctiveness or pattern distinctiveness) after exposure and development is poor, part of unexposed resin is left behind, and much time is required for inspecting chipping or peeling off of pattern edges, which cause the working efficiency to be lowered.

In order to improve the degree of pattern distinctiveness, a method was proposed in JP-A-5-72739 in which transparent inorganic particles were added in the oxygen-barrier layer of a photosensitive printing plate. A sensitivity was degraded because of the additive being inorganic particles and thereby the sensitivity was not able to reach a necessary level for a high speed plate manufacturing.

In light of such a present state, the inventors have conducted intensive investigations on the above-mentioned problems. It has been found that a photosensitive resin composition comprising the following components of an optically-radical-generating agent that generates a radical in the mass of the resin composition on exposure to light of a specific wavelength, an acid-generating agent that generates an acid on exposure to light of a shorter wavelength than the above-mentioned specific wavelength and a chemical compound developing a color with the action of the acid, is capable of being sensitive on exposure to visible laser light, and that a photosensitive printing plate with the resin composition layer laminated thereon has good characteristics such as a high sensitivity, a high resolution power, easy handling, and good storage stability. Besides, a method of manufacturing a printing master plate has been also found. The present invention has been completed on the basis of the above findings.

SUMMARY OF THE INVENTION

It is an object of the present invention to provide a photosensitive resin composition used for manufacturing a photosensitive printing plate which is capable of a sensitive exposure to visible laser light.

It is another object of the present invention to provide a photosensitive printing plate or pre-sensitized plate which has a layer of the above-mentioned photosensitive resin composition laminated on a substrate and which is capable of not only being handled with ease, but also being stored with good stability for a long term.

It is a further object of the present invention to provide a method of manufacturing a printing master plate from the above-mentioned photosensitive printing plate.

The present invention relates to a photosensitive resin composition comprising a high polymeric binder, a monomer, a photopolymerization initiator generating radicals on exposure to visible light of a wavelength of 400 to 700 nm, an optically-acid-generating agent generating an acid on exposure to light of a wavelength of 200 to 380 nm, a chemical compound developing a color in the presence of the acid, to a photosensitive printing plate using the same, and to a method of manufacturing a printing master plate.

A photosensitive resin composition according to the present invention has a wide range of wavelengths of light to which the resin composition is sensitive on exposure and forms a good image with visible laser. A photosensitive printing plate manufactured by using the resin composition has a high degree of pattern distinctiveness, an easy handling characteristic, and an excellent working efficiency.

In manufacturing a printing master plate from the photosensitive resin composition, a photosensitive printing plate is exposed to visible light of a wavelength of 400 to 700 nm in imagewise configuration and further subjected to radiation of a wavelength in the range of 200 to 380 nm which is shorter than that of the former. The above-mentioned method is simple and easy, and therefore industrially useful.

DETAILED DESCRIPTION OF THE INVENTION

The photosensitive resin composition comprises, as described above, a high polymeric binder, a monomer, a photopolymerization initiator generating radicals on exposure to visible light of a wavelength of 400 to 700 nm, an optically-activated acid generating agent generating an acid on exposure to light of a wavelength of 200 to 380 nm, a chemical compound developing a color in the presence of the acid. The high polymeric binders having a molecular weight greater than 10,000 which can be preferably used in the present invention include copolymers from monomers selected from the group comprising of acrylic acid, methacrylic acid, methyl acrylate, methyl methacrylate, ethyl acrylate, ethyl methacrylate, propyl acrylate, propyl methacrylate, butyl acrylate, butyl methacrylate, hydroxyethyl acrylate, hydroxyethyl methacrylate, hydroxypropyl acrylate, hydroxypropyl methacrylate, benzyl acrylate, benzyl methacrylate, phenoxyacrylate, phenoxymethacrylate, isobornyl acrylate, isobornyl methacrylate, glycidyl acrylate, glycidyl methacrylate, styrene, α-methyl styrene, ( o-, m-, or p- ) hydroxystyrene, acrylamide, methacrylamide, diacetone acrylamide, diacetone methacrylamide, N-methylol acrylamide, N-methylol methacrylamide, N-butoxymethyl acrylamide, N-butoxymethyl methacrylamide, acrylonitrile, methacrylonitrile and the photosensitive resin composition of the like. Monomers having a carboxyl group such as acrylic acid or methacrylic acid may be preferably mixed into the components of copolymerization at about 5 to 40 wt % because development can be conducted in a alkaline aqueous solution.

The above-mentioned high polymeric binders each may be preferably contained at 10 to 85 wt % relative to the total weight of the high polymeric binder, a monomer, an initiator of photopolymerization, an optically-activated acid generating agent, and an acid-activated color former. When the content of a binder is lower than 10 wt %, a film forming characteristic becomes poor and with more than 85 wt % a degree of endurance in printing is also lowered.

The monomers which can be used in the present invention include the above-mentioned monomers used in synthesis of the above-mentioned high polymeric binders and besides preferably include a multifunctional monomer selected from the group comprising of ethylene glycol diacrylate, ethylene glycol dimethacrylate, triethylene glycol diacrylate, triethylene glycol dimethacrylate, tetraethylene glycol diacrylate, tetraethylene glycol dimethacrylate, propylene glycol diacrylate, propylene glycol dimethacrylate, trimetylol propane triacrylate, trimetylol propane trimethacrylate, tetramethylol propane tetracrylate, tetramethylol propane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate and the like.

The content of a monomer is preferably adjusted in the range of 15 to 70 wt % relative to the total weight of the composition of a high polymeric binder, the monomer, a photopolymerization initiator, an optically-activated acid generating agent, and an acid-activated color former. When a content is lower than 15 wt %, poor optical hardening occurs and thereby a degree of printing endurance and chemical resistance do not reach a level of practical use, and with more than 70 wt % a film forming characteristic becomes poor.

The photopolymerization initiators of the present invention which each generates a radical on exposure to visible light of a wavelength from 400 to 700 nm preferably include at least one compound selected from the group consisting of triazine compounds, titanocene compounds, and acridine compounds.

The triazine compounds represented by the following formulae are specially used in a useful manner.

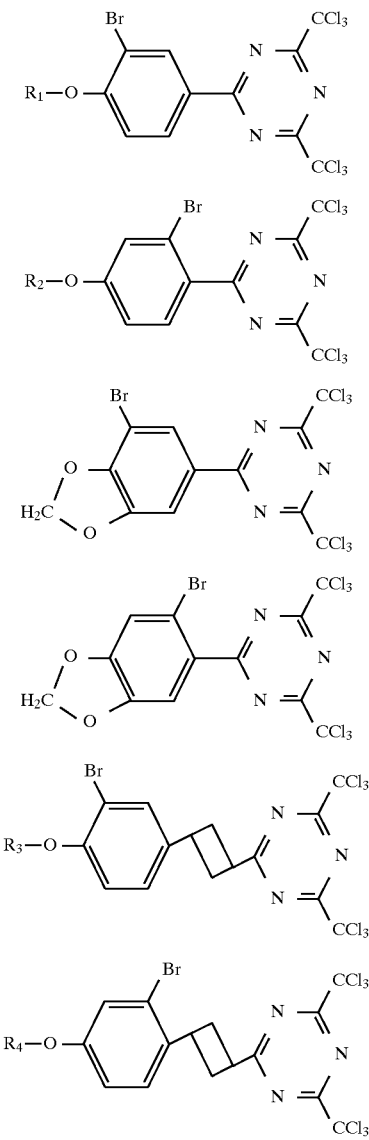

wherein $R_1$ to $R_4$ each represents an alkyl group having any of 1 to 3 carbon atoms.

The titanocene compounds represented by the following formula are used in a useful manner.

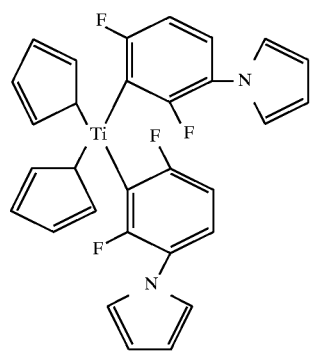

The acridine compounds represented by the following formulae are used in a useful manner.

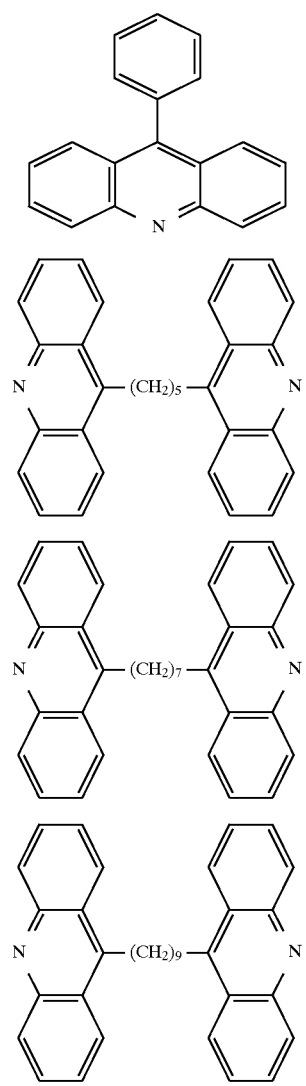

In the presence of an initiator selected from the above-mentioned photopolymerization initiators, as needed, at least one compound can be added that is selected from the group comprising of benzophenone derivatives such as benzophenone, 4,4'-bis (dimethylamino)benzophenone, 3,3'-dimethyl-4-methoxy-benzophenone and the like, anthraquinone derivatives such as anthraquinone, 2-methyl anthraquinone, 2-ethyl anthraquinone, tert-butyl anthraquinone and the like, benzoine alkyl ether derivatives such as benzoin, benzoin methyl ether, benzoin ethyl ether, benzoin propyl ether and the like, thioxanthone derivatives such as 2-chloro thioxanthone, diethyl thioxanthone, isopropyl thioxanthone, di-isopropyl thioxanthone and the like, acetophenone derivatives such as acetophenone, 2,2-dimethoxy-2-phenyl-acetophenone, 2-hydroxy-2-methyl propiophenone, 4'-isopropyl-2-hydroxy-2-methyl propiophenone, 2-methyl-1-[4-(methylthio)phenyl]-2-morpholino-1-propane and the like, 2,4,6-(trichloromethyl) triazine, 2-(o-chlorophenyl)-4,5-diphenyl imidazolyl dimer, 9-phenyl acridine, 1,7-bis (9-acridinyl)heptane, 1,5-bis(9-acridinyl)pentane, 1,3-bis(9-acridinyl)propane, 2-benzil-2-dimethylamino-1-(4-morpholinophenyl)phenyl)-butane-1-one.

The content of a photopolymerization initiator is preferably adjusted in the range of 1 to 30 wt % relative to the total weight of the composition of a high polymeric binder, a monomer, the photopolymerization initiator, an optically-acid-generating agent, and an acid-activated color former. When a content is lower than 1 wt %, optical hardening becomes poor and thereby a degree of printing endurance and chemical resistance do not reach a level of practical use, and with more than 30 wt % a degree of printing endurance becomes again poor.

The optically-activated acid generating agents each used in combination with a photoplymerization initiator which each generates an acid on exposure to light of a wavelength from 200 to 380 nm include a compound comprising of halogeno-hydrocarbons such as carbon tetrabromide, iodoform, hexachloroethane, 2,2,2-tribromoethanol, p-nitrobenzotrichloride, benzotribromide, α,α,α,α',α',α'-hexachloro- xylene, dichlorobromomethane, 2-ω,ω,ω-trichloromethyl-6-nitrobenzothiazole, ω,ω,ω-tribromoquinaldine, 4-ω,ω,ω-tribromomethylpyridine, and the like, halogen-containing ketones such as trichloroacetoamide, N-ethyl-tribromoacetoamide, p-nitro-α,α,α-tribromoacetophenone, α,α,α-trichloroacetophenone, and the like, sulfoxides such as pentabromo-dimethyl sulfoxide, sulfones such as hexabromomethyl sulfone, trichloromethyl phenyl sulfone, hexachlorodimethyl sulfone, thiazoles such as 2-tribromomethylsul- fonyl-6-methoxy benzothiazole, 2-tribromomethylsulfonyl-5-nitrobenzothiazole, imidazoles such as 1-methyl-2-tribromomethyl sulfone-benzoimidazole, 1-methyl-2-tribromosulfone-benzoimidazole.

Among the above-mentioned acid generating agents, the following compounds can be preferably used, which are trichloroacetoamide, 2-tribromomethylsulfonyl-6-methoxybenzothiazole, 1-methyl-2-tribromomethyl sulfone-benzoimidazole, 1-methyl-2-tribromosulfone-benzoimidazol.

The compounds which each develops a color or color formers comprise the following ones, which are, the triphenylmethane-phthalide compounds such as

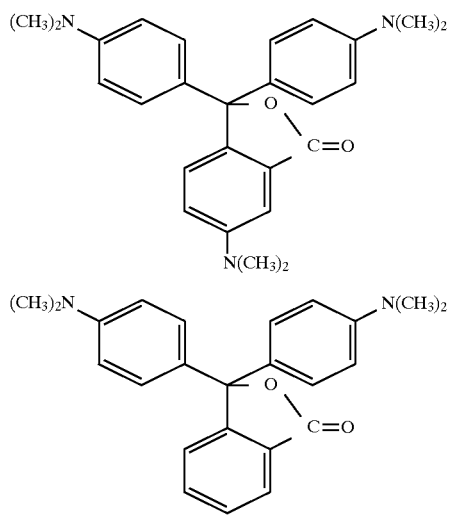

the fluoran compounds such as
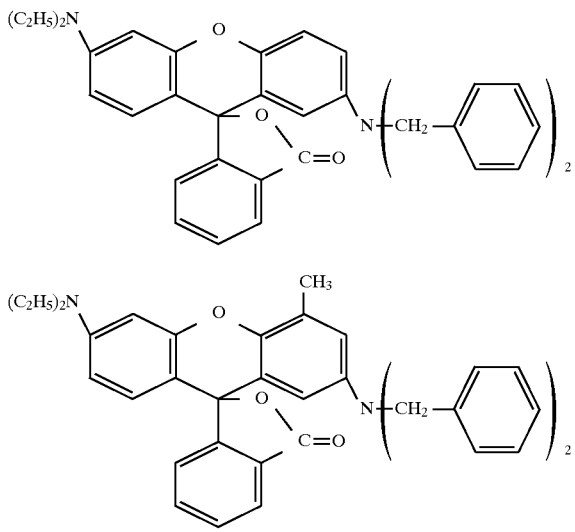
the phenothiazine compounds such as
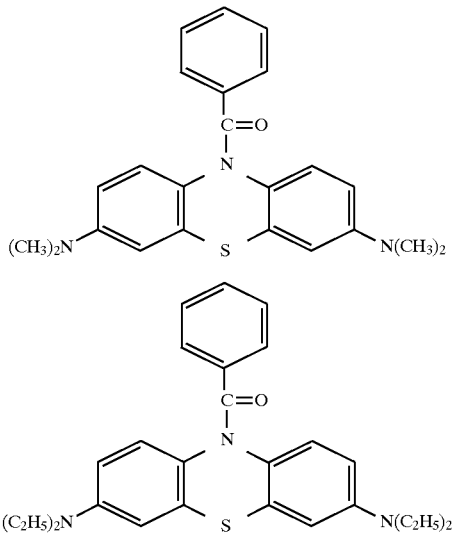
the indolil phthalide based compounds such as
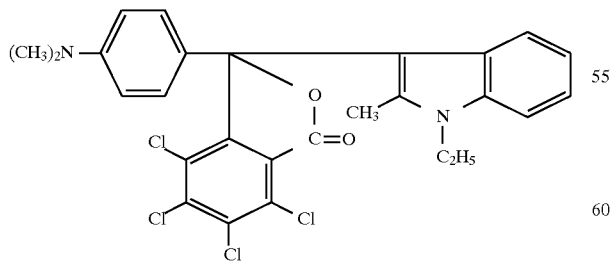
the leucoauramine compounds such as
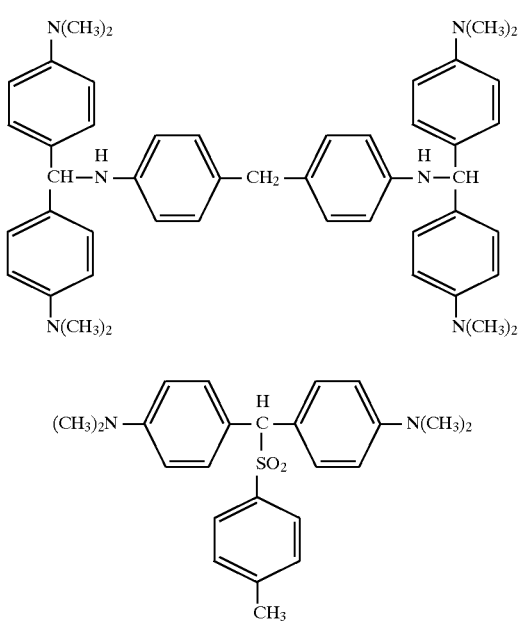
the spiropyrane compounds such as
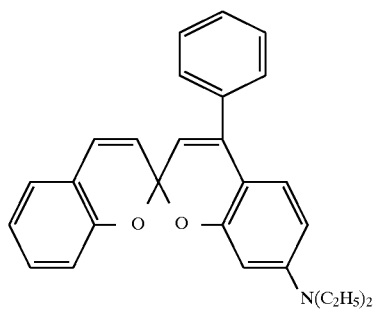
the rhodamine lactam compounds such as
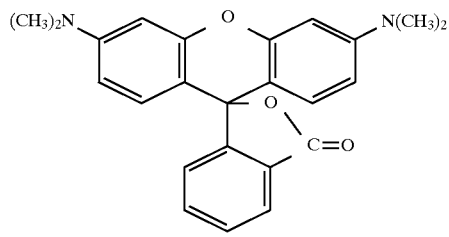
the triphenylmethane compounds such as

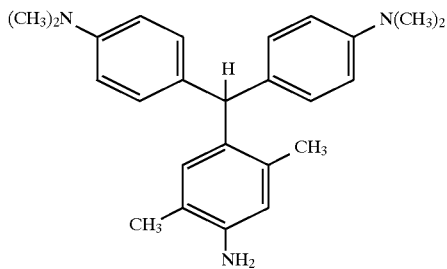

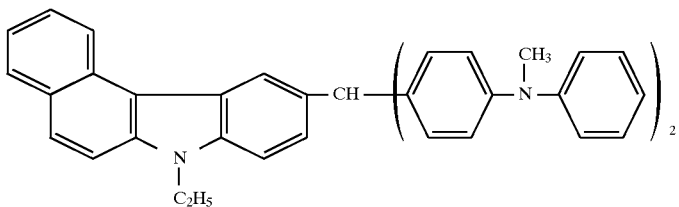

the azaphthalide compounds such as

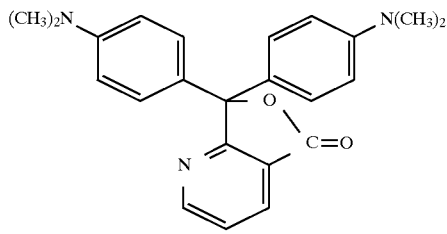

the chromenoindole compounds such as

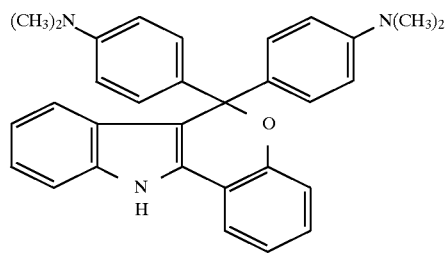

Among the above-mentioned compounds, the triphenylmethane-phthalide compounds, the fluoran compounds, the leucoauramine compounds, and the rhodamine lactam compounds, especially the following compounds, which are:

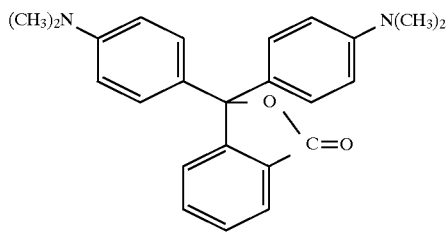

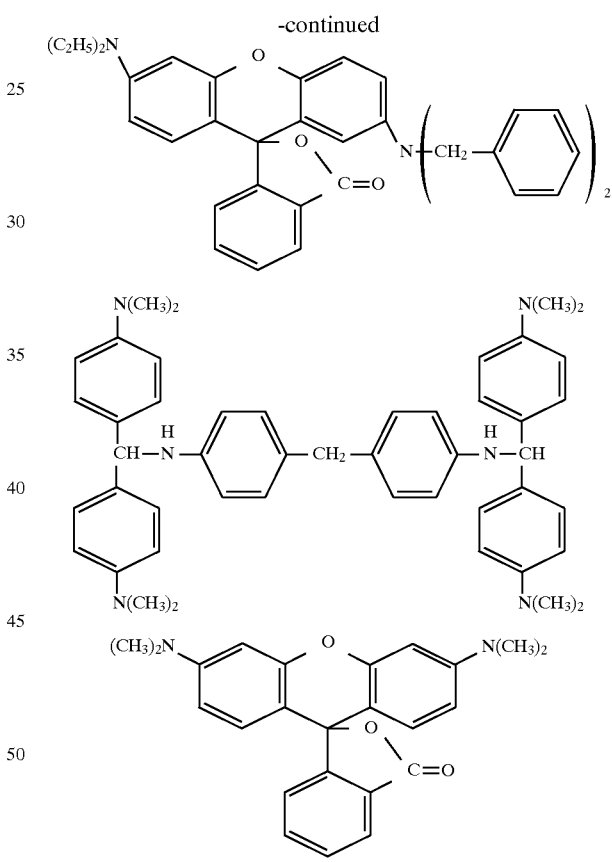

are preferred because each has a high color developing ability. A photosensitive printing plate using the same shows an excellent pattern distinctiveness and a change in the characteristics after a long term storage is small. Therefore, it is preferably used.

It is preferred that the contents of an optically acid generating agent and an acid activated color former are respectively adjusted in the same range of 0.001 to 5 parts by wt relative to of the total 100 parts by wt of the composition of a high polymeric binder, a monomer, a photopolymerization initiator, an optically-acid-generating agent, and an acid-activated color former. When contents are lower than 0.001 parts, pattern distinctiveness is not improved and on the other hand with more than 5 parts not only a sensitivity, but a degree of printing endurance are reduced.

A photosensitive resin composition according to the present invention can be, as needed, mixed with a solvent selected from the group comprising of ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, and 4-propoxybutyl acetate, 2-methoxypentyl acetate, with a thermopolymerization inhibitor such as hydroquinone, hydroquinone monoethyl ether and the like, with silicone resin based or fluoropolymer based defoamer, with anionic, cationic, or nonionic surface active agent, and with a mat agent such as silica or the like, wherein all the above-named additives are publicly known.

A photosensitive printing plate according to the present invention is manufactured by laminating a photosensitive resin composition above mentioned on a substrate. An oxygen-barrier layer, as needed, can be further laminated on the photosensitive resin composition layer on the substrate.

As a substrate mentioned above, substances such as paper, polyethylene telephthalate, iron, aluminum or the like each is suitable for it. An aluminum plate treated by surface treatments such as mechanical surface graining or anodic oxidation and, if necessary, sealing or the like is especially suitable for the substrate.

A linear organic high polymer such as polyvinyl alcohol or water-soluble nylon which exerts a high effect of intercepting penetrating oxygen and shows a high solubility in water or an alkaline aqueous solution is preferably used as an oxygen-barrier layer. The dry thickness is preferably set in the range of 0.1 to 10 $\mu$m. When a thickness is set at less than 0.1 $\mu$m, no oxygen intercepting effect is observed and with a thickness more than 10 $\mu$m an optical sensitivity is impeded.

A photosensitive printing plate is prepared by coating on the substrate a photosensitive resin composition alone or, as needed, together with other additives such as a solvent, a dispersing agent, a defoaming agent, individually or in combination, by means of a whirler, a roll coater, a reverse coater, an electrostatic coater, a spin coater, a bar coater or the like so as to have the dry thickness controlled to be 5 to 10 g/m$^2$. In order to apply an oxygen-barrier layer on the layer of a photosensitive resin composition, a linear organic high polymer devolved in water or an organic solvent such as alcohol is coated on the photosensitive resin composition layer by means of a bar coater, a whirler, or the like.

A photosensitive printing plate is exposed directly to visible light such as argon laser or the like, when energy of laser is preferably set in the dose range of 0.03 to 5 mJ/cm$^2$. After imagewise exposure to argon laser and development, another exposure to light of a wavelength of from 200 to 380 nm is conducted, in whole or in part, on the surface of the developed sensitive printing plate for the purpose of manufacturing a printing master plate. Development is carried out by means of dipping, spraying or the like, and a developing solution is selected from the group comprising of an organic substance such as monoethanol amine, diethanol amine, triethanol amine, tetramethyl ammonium hydroxide and the like, and an aqueous solution of sodium hydroxide, potassium hydroxide, sodium carbonate, ammonia and the like.

Next, the present invention will be further illustrated in the following examples of its practice, but it should be strictly understood that the invention is not limited thereto.

EXAMPLE 1

The following components numbered 1 to 10 were kneaded at respective parts by wt, as shown bellow, to prepare a homogeneous photosensitive resin composition, which were:

| | | |
|---|---|---|
| 1. | a hight polymer binder composed of 50 parts by wt of methyl methacrylate, 20 parts by wt of acryl acid, 20 parts by wt of 2-hydroxyethyl methacrylate, 10 parts by wt of benzil methacrylate, | 60 parts by wt |
| 2. | trimethylol propane triacrylate, | 10 parts by wt |
| 3. | a triazine compound having the following structural formula, | 3 parts by wt |

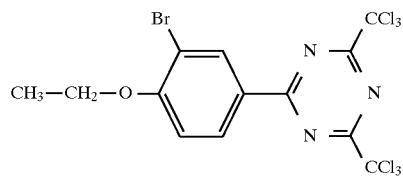

| | | |
|---|---|---|
| 4. | a titanocene compound having the following structural formula, | 10 parts by wt |

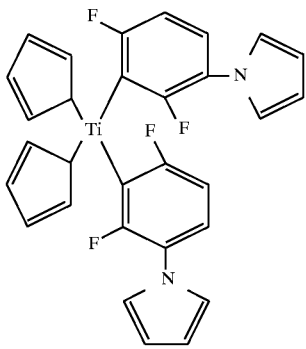

| | |
|---|---|
| 5. an acridine compound having the following structural formula, | 3 parts by wt |

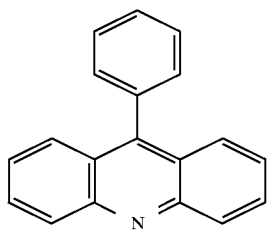

| | |
|---|---|
| 6. methylhydroquinone as a polymerization inhibitor, | 0.05 parts by wt |
| 7. an acid-activated color former having the following structural formula, | 0.1 parts by wt |

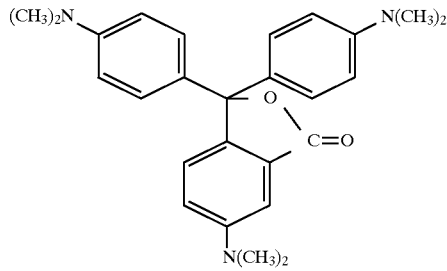

| | |
|---|---|
| 8. trichlroacetoamide, | 0.1 parts by wt |
| 9. propylene glycol monethyl ether acetate, | 100 parts by wt |
| 10. 3-methyl-3-methoxybutyl acetate | 50 parts by wt |

The above-mentioned photosensitive composition was coated on an aluminum plate of a thickness of 0.3 mm which had been treated by an anodic oxidation and sealing processes with a whirler so as to obtain a coated layer at a dry thickness of 3 g/m². Then, the aluminum plate were dried at 100° C. for 2 min. to give a dry photosensitive resin composition layer on the surface of its own. A polyvinyl alcohol aqueous solution of 20% in concentration, of which the degree of saponification was 80 mol % and the degree of polymerization was 500, was coated on the surface of the dry resin composition layer with a bar coater to give an overcoat of a dry thickness of 5 μm. A photosensitive printing plate was prepared by drying such an overcoated plate. The photosensitive printing plate was then exposed to argon layer of a wavelength of 488 nm at a dose of 0.8 mJ/cm² in an imagewise configuration to thereby obtain the precursor of a printing master plate. After the exposure was conducted, a printing pattern was developed in a sodium carbonate aqueous solution of a concentration of 0.5% at 25° C. for 2 min. After drying the developed printing pattern, the pattern was further exposed to ultraviolet light from an extra-high pressure mercury lamp for 1 min. The thus obtained pattern was clearly distinctive in details and easy in handling, and excellent in working efficiency.

After a gum liquid was applied on the surface, the printing master plate was used in a printing machine and 150,000 sheets of good printed matter were obtained.

EXAMPLE 2

A manufacturing of a printing master plate was carried out in the same way as that described in Example 1, except replacing the color former used in Example 1 by the following compound with a loading of 0.1 parts by wt, that is,

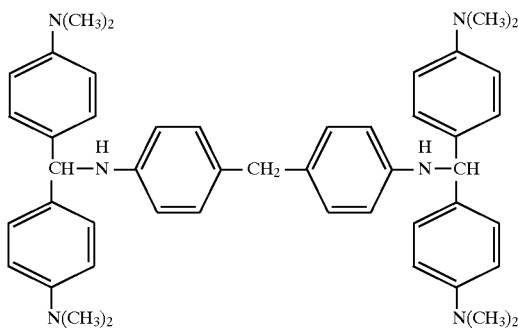

The handling characteristic and working efficiency were both good and after the application of gum liquid, printing was conducted with a printing machine. About 150,000 sheets of good printed matter were obtained.

EXAMPLE 3

A manufacturing of a printing master plate was carried out in the same way as that described in Example 1, except replacing 0.1 parts by wt of trichloroacetoamide used in Example 1 by 0.1 parts by wt of 2-tribromomethyl surfonyl-methoxybenzothiazole. The handling characteristic and working efficiency were both good in the same levels as those in Example 1 and after the application of gum liquid, printing was conducted with a printing machine. About 150,000 sheets of good printed matter were obtained.

EXAMPLE 4

A manufacturing of a printing master plate was carried out in the same way as that described in Example 1, except changing loading of the color former used in Example 1 to a loading of 0.05 parts by wt. The handling characteristic and working efficiency were both good in the same levels as those in Example 1 and after the application of gum liquid, printing was conducted with a printing machine. About 150,000 sheets of good printed matter were obtained.

EXAMPLE 5

A manufacturing of a printing master plate was carried out in the same way as that described in Example 1, except changing loading of acid generating agent used in Example 1 to a loading of 0.05 parts by wt. The handling characteristic and working efficiency were both good in the same levels as those in Example 1 and after the application of gum liquid, printing was conducted with a printing machine. About 150,000 sheets of good printed matter were obtained.

EXAMPLE 6

A manufacturing of a printing master plate was carried out in the same way as that described in Example 2, except changing the loading of the color former used in Example 2 to a loading of 2 parts by wt. The handling characteristic and working efficiency were both good in the same levels as those in Example 2 and after the application of gum liquid, printing was conducted with a printing machine. About 150,000 sheets of good printed matter were obtained.

EXAMPLE 7

A manufacturing of a printing master plate was carried out in the same way as that described in Example 1, except changing the loading of the acid generating agent used in Example 1 to a loading of 2 parts by wt. The handling characteristic and working efficiency were both good in the same levels as those in Example 1 and after the application of gum liquid, printing was conducted with a printing machine. About 150,000 sheets of good printed matter were obtained.

EXAMPLE 8

A manufacturing of a printing master plate was carried out in the same way as that described in Example 1, except replacing 0.1 parts by wt of trichloroacetoamide used in Example 1 by 0.1 parts by wt. of 1-methyl-2-tribromosulfone-benzoimidazole and replacing 0.1 parts by wt of the color former used in Example 1 by 0.1 parts by wt of the following compound, that is,

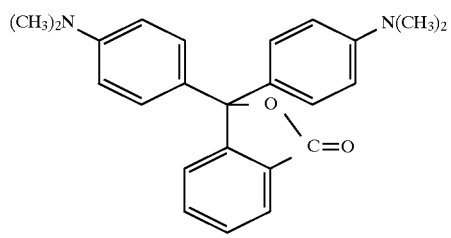

The handling characteristic and working efficiency were both good and after the application of gum liquid, printing was conducted with a printing machine. About 150,000 sheets of good printed matter were obtained.

EXAMPLE 9

A manufacturing of a printing master plate was carried out in the same way as that described in Example 1, except replacing the color former used in Example 1 by 0.1 parts by wt of the following compound that is,

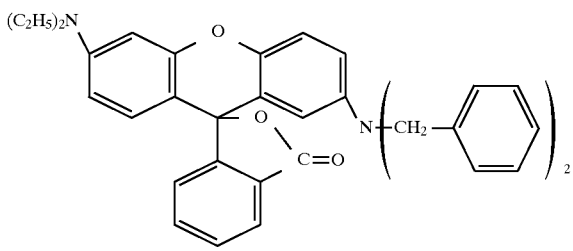

The handling characteristic and working efficiency were both good and after the application of gum liquid, printing was conducted with a printing machine. About 150,000 sheets of good printed matter were obtained.

COMPARATIVE EXAMPLE 1

A manufacturing of a printing master plate was carried out in the same way as that described in Example 1, except that a photosensitive resin composition composed of the remaining components after excluding the components of trichloroacetoamide and leucoauramine from the photosensitive resin composition used in Example 1 is used. The work for inspecting chipping or peeling off of pattern edges was difficult.

After the application of gum liquid, printing was tried with a printing machine. Some stains were, however, found on printed matters and retouching was indispensable.

What is claimed is:

1. A photosensitive resin composition, which comprises: a high polymer binder; a monomer; a photopolymerization initiator generating a radical on exposure to visible light of a wavelength of 400 to 700 nm comprised of at least one compound selected from the group consisting of triazine compounds, titanocene compounds, and acridine compounds; an optically-activated acid generating agent generating an acid on exposure to light of a wavelength of 200 to 380 nm which agent is at least one selected from the group consisting of trichloroacetoamide, N-ethyltribromoacetoamide, p-nitro-α,α,α-tribromoacetophenone, α,α,α-trichloroacetophenone, 2-tribromomethylsulfonyl-6-methoxybenzothiazole, 1-methyl-2-tribromomethylsulfone-benzoimidazole, and 2-tribromomethylsulfonyl-5-nitrobenzo-thiazole; and a color former developing a color in the presence of an acid.

2. The photosensitive resin composition as claimed in claim 1, wherein the optically-activated acid generating agent is at least one selected from the group consisting of trichloroacetoamide, 2-tribromo-methylsulfonyl-6-methoxybenzothiazole, and 1-methyl-2-tribromomethylsulfone-benzoimidazole.

3. The photosensitive resin composition as claimed in claim 1, wherein the color former is at least one selected from the group consisting of triphenylmethane-phthalide compounds, fluoran compounds, phenothiazine compounds, indolil phthalide compounds, leucoauramine compounds, spiropyrane compounds, rhodamine lactam compounds, triphenylmethane compounds, azaphthalide compounds, and chromenoindole compounds.

4. The photosensitive resin composition as claimed in claim 3, wherein the color former is at least one selected from the group consisting of triphenylmethane-phthalide compounds, fluoran compounds, leucoauramine compounds, and rhodamine lactam compounds.

5. The photosensitive resin composition as claimed in claim 4, wherein the color former is at least one selected from the group consisting of

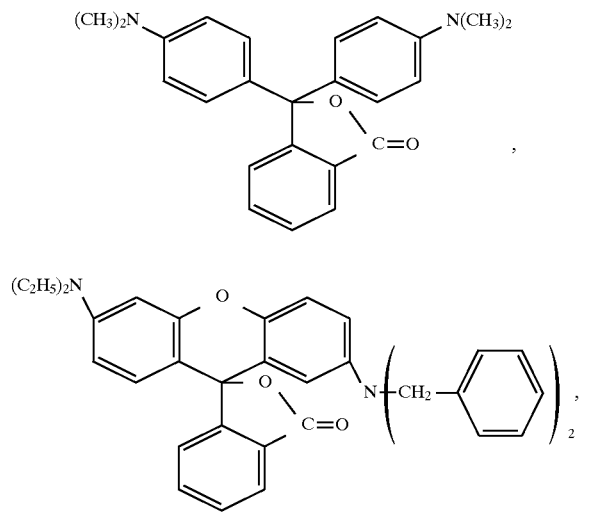

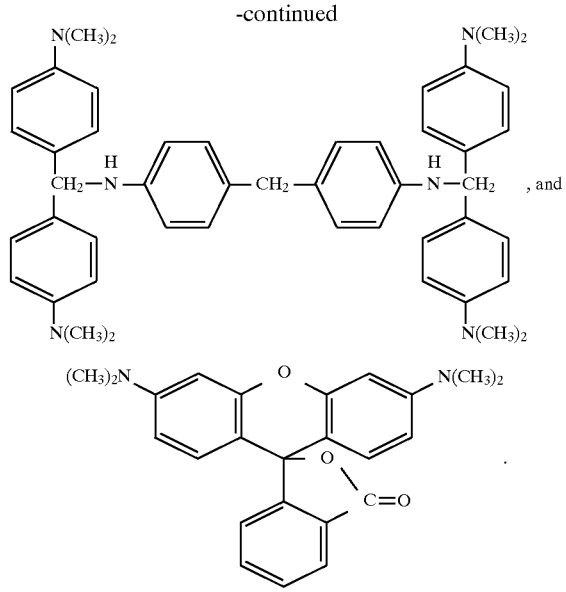

6. The photosensitive resin composition as claimed in claim 1, wherein the composition comprises, based on the weight of the composition, from 10 to 85% by weight of the polymer binder, from 15 to 70% by weight of the monomer, from 1 to 30% by weight of the photopolymerization initiator, and from 0.001 to 5% by weight each of the optically-activated acid generating agent and the color former.

7. The photosensitive resin composition as claimed in claim 1, wherein the polymer binder is at least one copolymer made from polymerizing compounds selected from group consisting of acrylic acid, methacrylic acid, methyl acrylate, methyl methacrylate, ethyl acrylate, ethyl methacrylate, propyl acrylate, propyl methacrylate, butyl acrylate, butyl methacrylate, hydroxyethyl acrylate, hydroxyethyl methacrylate, hydroxypropyl acrylate, hydroxypropyl methacrylate, benzyl acrylate, benzyl methacrylate, phenoxyacrylate, phenoxymethacrylate, isobornyl acrylate, methacrylate, glycidyl acrylate, glycidyl methacrylate, styrene, α-methyl styrene, (o-, m-, or p-) hydroxystyrene, acrylamide, methacrylamide, diacetone acrylamide, diacetone isobornyl methacrylamide, N-methylol acrylamide, N-methylol methacrylamide, N-butoxymethyl acrylamide, N-butoxymethyl methacrylamide, acrylonitrile, and methacrylonitrile; the monomer is at least one selected from the group consisting of ethylene glycol diacrylate, ethylene glycol dimethacrylate, triethylene glycol diacrylate, triethylene glycol dimethacrylate, tetraetylene glycol diacrylate, tetraethylene glycol dimethacrylate, propylene glycol diacrylate, propylene glycol dimethacrylate, trimetylol propane triacrylate, trimetylol propane trimethacrylate, tetramethylol propane tetracrylate, tetramethylol propane tetramethacrylate, pentaerythritol triacrylate, pentaerythritol trimethacrylate, penta-erythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate; and the color former is at least one selected from the group consisting of triphenylmethane-phthalide compounds, flouran compounds, phenothiazine compounds, indolil phthalide compounds, leucoauramine compounds, spiropyrane compounds, rhodamine lactam compounds, triphenyl-methane compounds, azaphthalide compounds and chromenoindole compounds.

8. The photosensitive resin composition as claimed in claim 7, wherein the composition comprises, based on the weight of the composition, from 10 to 85% by weight of the polymer binder, from 15 to 70% by weight of the monomer, from 1 to 30% by weight of the photopolymerization initiator, and from 0.001 to 5% by weight each of the optically-activated acid generating agent and the color former.

9. A photosensitive printing plate having a substrate and a layer laminated thereto made from a photosensitive resin composition comprising a high polymer binder; a monomer; a photopolymerization initiator generating a radical on exposure to visible light of wavelength of 400 to 700 nm comprised of at least one compound selected from the group consisting of triazine compounds, titanocene compounds, and acridine compounds; an optically-activated acid generating agent generating an acid on exposure to light of a wavelength of 200 to 380 nm which agent is at least one selected from the group consisting of trichloroacetoamide, N-ethyl-tribromoacetoamide, p-nitro-α,α,α-tribromoaceto-phenone, α,α,α-trichloro-acetophenone, 2-tribromo-methylsulfonyl-6-methoxy benzothiazole, 1-methyl-2-tribromomethylsulfone-benzoimidazole, and 2-tribromomethylsulfonyl-5-nitrobenzo-thiazole; and a color former developing a color in the presence of an acid.

10. The photosensitive printing plate claimed in claim 9, wherein the optically-activated acid generating agent generating an acid is at least one selected from the group consisting of trichloroacetoamide, 2-tribromomethyl-sulfonyl-6-methoxybenzothiazole, and 1-methyl-2-tribromometylsulfone-benzoimidazole.

11. The photosensitive printing plate claimed in claim 9, wherein the color former developing a color in the presence of a acid is at least one selected from the group consisting of triphenylmethane-phthalide compounds, fluoran compounds, phenothiazine compounds, indolil phthalide compounds, leucoauramine compounds, spiropyrane compounds, rhodamine lactam compounds, triphenyl-methane compounds, azaphthalide compounds, and chromenoindole compounds.

12. The photosensitive printing plate claimed in claim 11, wherein the color former is at least one selected from the group consisting of triphenylmethane-phthalide compounds, fluoran compounds, leucoauramine compounds, and rhodamine lactam compounds.

13. The photosensitive printing plate claimed in claim 12, wherein the color former is at least one selected from the group consisting of

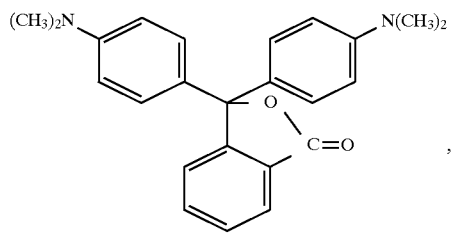

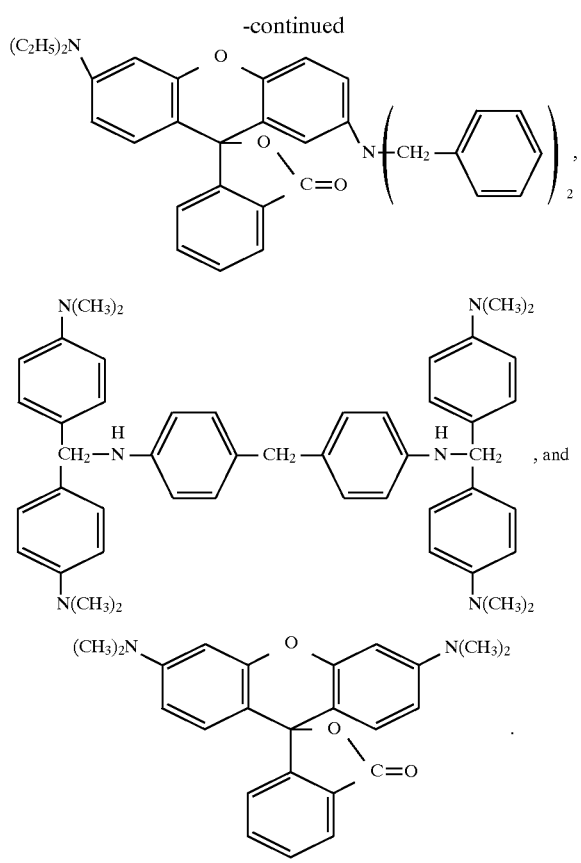

14. The photosensitive printing plate claimed in claim 9, wherein the composition comprises, based on the weight of the composition, from 10 to 85% by weight of the polymer binder, from 15 to 70% by weight of the monomer, from 1 to 30% by weight of the photopolymerization initiator, and from 0.001 to 5% by weight each of the optically-activated acid generating agent and the color former.

15. The photosensitive resin composition as claimed in 9, wherein the polymer binder is at least one copolymer made from polymerizing compounds selected from group consisting of acrylic acid, methacrylic acid, methyl acrylate, methyl methacrylate, ethyl acrylate, ethyl methacrylate, propyl acrylate, propyl methacrylate, butyl acrylate, butyl methacrylate, hydroxyethyl acrylate, hydroxyethyl methacrylate, hydroxypropyl acrylate, hydroxypropyl methacrylate, benzyl acrylate, benzyl methacrylate, phenoxyacrylate, phenoxymethacrylate, isobornyl acrylate, isobornyl methacrylate, glycidyl acrylate, glycidyl methacrylate, styrene, α-methyl styrene, (o-, m-, or p-) hydroxystyrene, acrylamide, methacrylamide, diacetone acrylamide, diacetone methacrylamide, N-methylol acrylamide, N-methylol methacrylamide, N-butoxymethyl acrylamide, N-butoxymethyl methacrylamide, acrylonitrile, and methacrylonitrile; the monomer is at least one selected from the group consisting of ethylene glycol diacrylate, ethylene glycol dimethacrylate, triethylene glycol diacrylate, triethylene glycol dimethacrylate, tetraetylene glycol diacrylate, tetraethylene glycol dimethacrylate, propylene glycol diacrylate, propylene glycol dimethacrylate, trimetylol propane triacrylate, trimetylol propane trimethacrylate, tetramethylol propane tetracrylate, tetramethylol propane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate; and color former is at least one selected from the group consisting of triphenylmethane-phthalide compounds, fluoran compounds, phenothiazine compounds, indolil phthalide compounds, leucoauramine compounds, spiropyrane compounds, rhodamine lactam compounds, triphenylmethane compounds, azaphthalide compounds, and chromenoindole compounds.

16. The photosensitive printing plate claimed in claim 15, wherein the composition comprises, based on the weight of the composition, from 10 to 85% by weight of the polymer binder, from 15 to 70% by weight of the monomer, from 1 to 30% by weight of the photopolymerization initiator, and from 0.001 to 5% by weight each of the optically-activated acid generating agent and the color former.

17. The photosensitive printing plate claimed in claim 9, wherein the layer of the photosensitive resin composition is coated on the substrate at a dry thickness in the range of 0.5 to 10 g/m$^2$.

18. The photosensitive printing plate claimed in claim 9, further including an oxygen-barrier layer is overcoated on the photosensitive resin composition layer.

19. The photosensitive printing plate claimed in claim 18, wherein the oxygen-barrier layer has a thickness in the range of 0.1 to 10 μm.

* * * * *